United States Patent
Matsuura et al.

(10) Patent No.: US 6,248,613 B1
(45) Date of Patent: *Jun. 19, 2001

(54) PROCESS FOR FABRICATING A CRACK RESISTANT RESIN ENCAPSULATED SEMICONDUCTOR CHIP PACKAGE

(75) Inventors: Hidekazu Matsuura, Oyama; Yoshihide Iwazaki; Naoto Ohta, both of Tsukuba, all of (JP)

(73) Assignee: Hitachi Chemical Company, Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/468,684

(22) Filed: Dec. 21, 1999

Related U.S. Application Data

(63) Continuation of application No. 09/044,575, filed on Mar. 19, 1998, now Pat. No. 6,046,072, which is a continuation of application No. 08/542,576, filed on Oct. 13, 1995, which is a continuation-in-part of application No. 08/514,353, filed on Jul. 27, 1995, now abandoned, which is a continuation of application No. 08/218,544, filed on Mar. 28, 1994, now abandoned.

(30) Foreign Application Priority Data

Mar. 29, 1993 (JP) .................................................. 5-91870
Mar. 29, 1993 (JP) .................................................. 5-91899
Jan. 31, 1994 (JP) .................................................. 6-25939

(51) Int. Cl.$^7$ ............................ H01L 21/44; H01L 21/48; H01L 21/50

(52) U.S. Cl. ........................... 438/106; 438/118; 438/127

(58) Field of Search .................................... 438/106, 118, 438/127

(56) References Cited

U.S. PATENT DOCUMENTS 4,545,840 * 10/1985 Newman et al. ................ 156/330.9
4,862,245 * 8/1989 Pashby et al. .................... 437/220
4,862,246   8/1989 Masuda et al. ..................... 357/70
5,068,712  11/1991 Murakami et al. .................. 357/72
5,140,404   8/1992 Fogal et al. ........................ 357/70
5,254,412  10/1993 Fujimoto .
5,286,679 * 2/1994 Farnworth et al. ............... 437/220
5,304,842 * 4/1994 Farnworth et al. ............... 257/668
5,434,106 * 7/1995 Lim et al. ........................ 437/220
5,441,918 * 8/1995 Morisaki et al. .
5,714,405 * 2/1998 Tsubosaki et al. .
6,046,072 * 4/2000 Matsuuro et al. .

FOREIGN PATENT DOCUMENTS 61-218139   9/1986 (JP) .
61-241959  10/1986 (JP) .
63-186735   8/1988 (JP) .

(List continued on next page.)

OTHER PUBLICATIONS

Matsuura et al., "Polimides & Resins" (Nov. 13, 1991) EP–456515, Chem Abs. (116:256718).*
Charles A. Harper and Ronald N. Sampson, Electronic Materials and Processes Handbook, p. 1.37, 2.19, 1994.*
Harper et al., Electronic Materials and Process Handbook, p. 1.64, 2.89, 1994.
Matsuura et al., "Polimides & resins" (Nov. 13, 1991) EP–466515, Chem. Abs. (116:256718).

*Primary Examiner*—Kevin M. Picardat
*Assistant Examiner*—D. M. Collins
(74) *Attorney, Agent, or Firm*—Pennie & Edmonds LLP

(57) ABSTRACT

A heat-resistant adhesive is provided for use in an adhesive member for the fabrication of a semiconductor package by bonding a semiconductor chip to a lead frame with the adhesive member and sealing at least the semiconductor chip and a bonded part between the semiconductor chip and the lead frame with a sealant. The adhesive has a coming-out length of not more than 2 mm and a water absorption rate of not more than 3 wt. %. Preferably, the adhesive has a glass transition point of at least 200° C.

13 Claims, 1 Drawing Sheet

FOREIGN PATENT DOCUMENTS

| | | |
|---|---|---|
| 2-36542 | 2/1990 | (JP) . |
| 2-036542 | 4/1990 | (JP) . |
| 3-64386 | 3/1991 | (JP) . |
| 3-109757 | 5/1991 | (JP) . |
| 4-318962 | 11/1992 | (JP) . |
| 5-67703 | 3/1993 | (JP) . |
| 5-021481 | 6/1993 | (JP) . |
| 5-112761 | 8/1993 | (JP) . |

* cited by examiner

US 6,248,613 B1

PROCESS FOR FABRICATING A CRACK RESISTANT RESIN ENCAPSULATED SEMICONDUCTOR CHIP PACKAGE

This is a continuation application under 37 C.F.R. 1.53 (b)(1) of prior application Ser. No. 09/044,575, filed Mar. 19, 1998 now U.S. Pat. No. 6,046,072, which is a continuation application of application Ser. No. 08/542,576, filed Oct. 13, 1995, which is a continuation-in-part of application Ser. No. 08/514,353 filed Jul. 27, 1995, now abandoned, which is a FWC of application Ser. No. 08/218,544, filed Mar. 28, 1994, now abandoned.

This application is a continuation-in-part of co-pending U.S. application Ser. No. 08/514,353 filed on Jul. 27, 1995, entitled "HEAT-RESISTANT ADHESIVE" which is a Continuation Application under C.F.R. § 1.62 for U.S. application Ser. No. 08/218,544 filed on Mar. 28, 1994.

BACKGROUND OF THE INVENTION

1. Field of the Invention

This invention relates to a heat-resistant adhesive especially suitable for the bonding of a semiconductor chip to a lead frame and an adhesive member using the adhesive.

More particularly, this invention relates to a heat-resistant adhesive suitable for use in a semiconductor package, especially a package of LOC (lead on chip) structure, which is capable of preventing or minimizing the occurrence of cracks when solder is subjected to reflow when the package has absorbed moisture.

2. Description of the Related Art

The semiconductor package is fabricated by connecting a lead frame to a semiconductor chip using an adhesive or resonance solder and electrically connecting electrodes of the chip to the lead frame, followed by sealing the entire structure into a molded form as illustrated in FIGS. 1 thru 3.

In general, a conventional package has a structure as shown in FIG. 3 where the chip is mounted on a tab (die pad) of the lead frame. The connection between the lead frame and the chip is made by Au—Si resonance solder or a thermosetting epoxy adhesive (a die bonding agent).

However, as the integration degree of in the package has become higher and a size of a chip to be mounted therein has become larger, the percentage of the volume occupied by the chip has become higher to such an extent that the chip cannot completely be encased in a structure as shown in FIG. 3 where the chip is mounted on the tab of the lead frame. To solve this problem, a package having no tab such as shown in FIG. 1 or FIG. 2 has been proposed, for example, in U.S. Pat. No. 5,140,404, Japanese Patent Application Publications (KOKAI) 61-218139 and 61-241959, U.S. Pat. No. 4,862,245, and Japanese Patent Application Publications (KOKAI) 2-36542 and 4-318962. The package structures of FIGS. 1 and 2 are called LOC (lead on chip) and COL (chip on lead), respectively. In these packages, the connection between the lead frame and the chip is made by a thermosetting adhesive or a heat-resistant hot melt.

With the structures as shown in FIGS. 1 and 2, it is the trend that as the package size is becoming smaller and thinner and the percentage of the occupation by the chip is becoming higher, the thickness of the sealing material is becoming thinner accordingly. Therefore, moisture absorbed by the adhesive or the sealing material would more readily often cause cracks in the package when it evaporates or expands.

To solve this problem, some attempts to improve the sealing materials and/or the adhesives employable for the package have been proposed. For example, with respect to the sealing materials, lowering of moisture absorption and improvement of mechanical strength have been discussed (Japanese Patent Application Publication (KOKAI) 5-67703). With respect to the adhesives, it has been proposed to reduce the moisture absorption or to divide an adhesive member into small pieces to promote escape of vapor during reflow in the soldering (Japanese Patent Application Publication (KOKAI) 3-109757). However, there have been no proposal directed toward modifying the properties of the adhesive to be employed for the LOC package.

There has been another attempt which intentionally allows a solvent to remain with a view to lowering a bonding temperature, lowering the viscosity of the resin (Japanese Patent Application Publication (KOKAI) 3-64386) or allows a solvent to remain to improve the fluidity and increase the adhesion to lower the possibility of a leak current between inner leads (Japanese Patent Application Publication (KOKAI) 2-36542).

SUMMARY OF THE INVENTION

It is therefore an object of the present invention to provide an adhesive suitable for use in a semiconductor package, especially a semiconductor package of LOC structure, which is capable of preventing possible cracks from occurring during reflow of solder when the package has absorbed moisture.

The inventors of the present invention has unexpectedly found, as a result of their research the relationship between cracks developed in the LOC package during reflow of the solder when package has absorbed moisture and the properties of the adhesive employed. The inventors have unexpectedly found that the fluidity or hardness of the adhesive at a high temperature has more impact on such package cracks than the moisture absorption or the glass transition point Tg of the adhesive. More particularly, they have found that an adhesive having a specific hardness or fluidity may advantageously be employed to prevent the package cracks in the LOC package. Thus, the present invention has been achieved.

Heretofore, it has only been known that the solvent may be intentionally left in the adhesive with a view to lowering the bonding temperature to lower the viscosity of the resin (KOKAI 3-64386) or the solvent may be left to enhance the fluidity and improve the adhesion for reducing current leakage between the inner leads (KOKAI 2-36542). It has not been known before the present invention that the hardness or retardation of the flow of the adhesive is more influential on the package cracks than the moisture absorption or Tg of the adhesion and that the adhesive having the specific hardness or fluidity is surprisingly effective to improve the resistance against the package cracks.

The present invention therefore provides:

(a) a heat-resistant adhesive suitable for use in an adhesive member for the fabrication of a semiconductor package by bonding a semiconductor chip to a lead frame with the adhesive member and molding at least the semiconductor chip and the bonded part between the semiconductor chip and the lead frame with a molding compound, in which the heat-resistant adhesive has a coming-out-length of not more than 2 mm and a water absorption rate of not more than 3 wt. %, (b) a heat-resistant adhesive suitable for use in an adhesive member for the fabrication of a semiconductor package by bonding a semiconductor chip to a lead frame with the adhesive member and molding at least the semiconductor chip and the bonded part between the semiconductor chip and the lead frame with a molding compound, in which the heat-resistant adhesive has a coming-out length of not more than 2 mm, a water absorption rate of not more than 3 wt. % and a glass transition temperature of at least 200° C., (c) a heat-resistant adhesive, in which the adhesive member is a composite adhesive sheet comprising a heat-resistant film and the heat-resistant adhesive applied in the form of a coating layer on one surface or opposite surfaces of the heat-resistant film, and (d) a heat-resistant adhesive, in which the adhesive member consists of the heat-resistant adhesive alone. The heat-resistant adhesives according to the present invention have excellent package-crack resistance and are effective especially for the improvement of the reliability of semiconductor packages.

The term "water absorption rate" used herein means a water absorption rate obtained from a change in weight of an adhesive before and after immersion in water. Here, a film of the adhesive having a size of 5 cm×5 cm with a thickness of 25 $\mu$m is used as a testing object and, after dried at 100° C. for 1 hour, it is immersed in water at 23° C. for 24 hours to measure the water absoprtion.

DETAILED DESCRIPTION OF THE PREFERRED EMBODIMENTS

Figure 1:
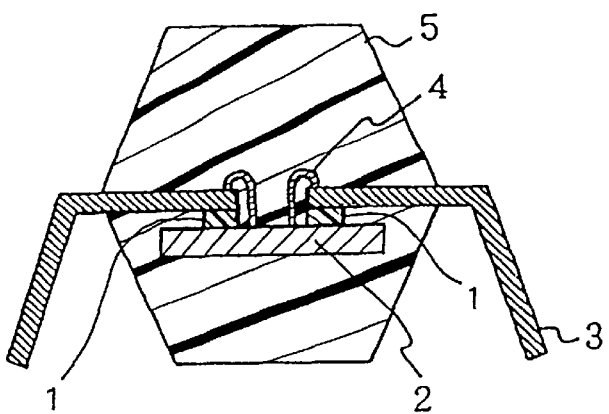
FIG. 1 schematically illustrates a semiconductor package fabricated by bonding a semiconductor chip to a lead frame with an adhesive member employing the heat-resistant adhesive of the present invention and then molding the semiconductor chip and the bonded part between the semiconductor chip and the lead frame with a molding compound, in which the semiconductor chip is located below the lead frame.

The present invention will hereinafter be described in detail.

No particular limitation is imposed on the specific heat-resistant adhesive employed in the present invention insofar as its water absorption rate and coming-out length are not more than 3 wt. % and not more than 2 mm. Among preferred heat-resistant adhesives are those with a principal constituent of a heat-resistant thermoplastic resin, preferably having a glass transition temperature of at least 200° C. For these reasons, a polyimide adhesive or a polyamide adhesive is preferred.

The term "polyimide" as used herein should be construed as embracing resins containing imide groups, such as polyamide-imides, polyester-imides, polyether-imides and polyimide.

The water absorption rate of the heat-resistant adhesive according to the present invention is 3 wt. % or less, preferably 2.5 wt. % or less, more preferably 2.0 wt. % or less. Its coming-out length is 2 mm or less, preferably 1 mm or less, more preferably 0.5 mm or less. In particular, the heat-resistant adhesive according to the present invention desirably has, in addition to the properties described above, a glass transition temperature of east 200° C., preferably 225° C. or higher, more preferably 250° C. or higher.

The term "coming-out length" as used herein means the length of a came-out peripheral portion of a 19×50 mm wide adhesive film of 25 $\mu$m in thickness as measured at a central part in the direction of the longer surfaces of the adhesive film when the adhesive film is pressed at 350° C. under 3 MPa for one minute.

Where the glass transition temperature is lower than 250° C. or the coming-out length is greater than 1 mm in the present invention, the water absorption rate is preferably not more than 3 wt. %, in particular, 1.5 wt. %. The thinner the sealing material is or the higher the percentage of the occupation of the adhesive in a package is, the more preferable it is to have a shorter coming-out length.

The adhesive according to the present invention can be formed of a polyimide or a polyamide alone. It is preferred to contain amide groups from the standpoint of adhesion.

The term "amide groups" as used herein mean amide groups still remaining after the ring closure for the formation of the polyimide. These amide groups therefore do not include the amide groups in an amic acid as an imide precursor.

Amide groups may mount to 10–90 mole %, preferably 20–70 mole %, more preferably 30–50 mole % of the sum of imide groups and amide groups. Percentages smaller than 10 mole % lead to small adhesion but percentages greater than 90 mole % result in a large water absorption rate.

The heat-resistant adhesive according to the present invention can be synthesized principally from (A) a diamine or (A') a diisocyanate and (B) an acid anhydride and/or (C) a dicarboxylic acid or an amide-forming derivative thereof. The heat-resistant adhesive can be easily produced by combining the above reactants and also adjusting their reaction ratio, reaction conditions and molecular weight, optionally adding additives while selecting their types and optionally adding an additional resin such as an epoxy resin in such a way that the resulting heat-resistant adhesive has the prescribed properties described above, namely, a coming-out length of not more than 2 mm a water absorption rate of not more than 3 wt. % and preferably a glass transition temperature of at least 200° C.

Examples of the diamine (A), which are usable in the present invention, include:

alkylenediamines such as hexamethylenediamine, octamethylenediamine and dodecamethylenediamine;

arylenediamines such as paraphenylenediamine, metaphenylenediamine and 2,4-diaminotoluene;

diaminophenyl derivatives such as 4,4'-diaminodiphenyl ether (DDE), 4,4'-diaminodiphenyl methane, 4,4'-diaminodiphenyl sulfone, 3,3'-diaminodiphenyl sulfone, 4,4'-diaminobenzophenone, 3,3'-diaminobenzophenone and 4,4'-diaminobenzanilide;

1,4-bis[1-(4-aminophenyl)-1-methylethyl]benzene (BAP);

1,3-bis[1-(4-aminophenyl)-1-methylethyl]benzene;

1,3-bis(3-aminophenoxy)benzene;

1,4-bis(3-aminophenoxy)benzene;

1,4-bis(4-aminophenoxy)benzene;

2,2-bis[4-(4-aminophenoxy)phenyl]propane (BAPP);

2,2-bis[4-(3-aminophenoxy)phenyl]propane;

bis[4-(3-aminophenoxy)phenyl)] sulfone (m-APPS);

bis[4-(4-aminophenoxy)phenyl] sulfone; and 2,2-bis[4-(4-aminophenoxy)phenyl]hexafluoropropane.

Also usable as the diamine (A) in the present invention include, for example, diamines represented by the following formula (1):.

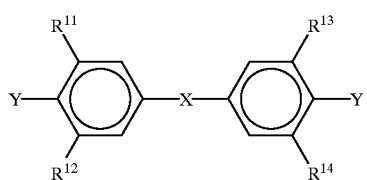
(1)

wherein Y represents an amino group; $R^{11}$, $R^{12}$, $R^{13}$ and $R^{14}$ independently represent a $C_{1-4}$ alkyl or alkoxyl group, at least two of which are independently an alkyl or alkoxyl group; and X is —$CH_2$—, —$C(CH_3)_2$—, —O—, —$SO_2$—, —CO— or —NHCO—.

Illustrative compounds represented by the formula (1) include:

4,4'-diamino-3,3',5,5'-tetramethyldiphenylmethane,
4,4'-diamino-3,3',5,5'-tetraethyldiphenylmethane,
4,4'-diamino-3,3',5,5'-tetra(n-propyl)diphenylmethane,
4,4'-diamino-3,3',5,5'-tetraisopropyldiphenylmethane,
4,4'-diamino-3,3',5,5'-tetrabutyldiphenylmethane,
4,4'-diamino-3,3'-dimethyl-5,5'-diethyldiphenylmethane,
4,4'-diamino-3,3'-dimethyl-5,5'-diisopropyidiphenylmethane,
4,4'-diamino-3,3'-diethyl-5,5'-diisopropyldiphenylmethane,
4,4'-diamino-3,5-dimethyl-3',5'-diethyldiphenylmethane,
4,4'-diamino-3,5-dimethyl-3',5'-diisopropyldiphenylmethane,
4,4'-diamino-3,5-diethyl-3',5'-diisopropyldiphenylmethane,
4,4'-diamino-3,5-diethyl-3',5'-dibutyldiphenylmethane,
4,4'-diamino-3,5-diisopropyl-3',5'-dibutyldiphenylmethane,
4,4'-diamino-3,3'-diisopropyl-5,5'-dibutyldiphenylmethane,
4,4'-diamino-3,3'-dimethyl-5,5'-dibutydiphenylmethane,
4,4'-diamino-3,3'-diethyl-5,5'-dibutyldiphenylmethane,
4,4'-diamino-3,3'-dimethyldiphenylmethane,
4,4'-diamino-3,3'-diethyldiphenylmethane,
4,4'-diamino-3,3'-di(n-propyl)diphenylmethane,
4,4'-diamino-3,3'-diisopropyldiphenylmethane,
4,4'-diamino-3,3'-dibutydiphenylmethane,
4,4'-diamino-3,3',5-trimethyldphenyimethane,
4,4'-diamino-3,3',5-triethyldiphenylmethane,
4,4'-diamino-3,3',5-tri(n-propyl)diphenylmethane,
4,4'-diamino-3,3',5-triisopropyldiphenylmethane,
4,4'-diamino-3,3',5-tributyldiphenylmethane,
4,4'-diamino-3-methyl-3'-ethyldiphenylmethane,
4,4'-diamino-3-methyl-3'-isopropyldiphenylmethane,
4,4'-diamino-3-ethyl-3'-isopropyldiphenylmethane,
4,4'-diamino-3-ethyl-3'-butyldiphenylmethane,
4,4'-diamino-3-isopropyl-3'-butyldiphenylmethane,
2,2-bis(4-amino-3,5-dimethylphenyl)propane,
2,2-bis(4-amino-3,5-diethylphenyl)propane,
2,2-bis[4-amino-3,5-di(n-propyl)phenyl]propane,
2,2-bis(4-amino-3,5-dibutylphenyl)propane,
4,4'-diamino-3,3',5,5'-tetramethyldiphenyl ether,
4,4'-diamino-3,3',5,5'-tetraethyldiphenyl ether,
4,4'-diamino-3,3',5,5'-tetra(n-propyl)diphenyl ether,
4,4'-diamino-3,3',5,5'-tetraisopropyldiphenyl ether,
4,4'-diamino-3,3',5,5'-tetrabutyldiphenyl ether,
4,4'-diamino-3,3',5,5'-tetramethyldiphenyl sulfone,
4,4'-diamino-3,3',5,5'-tetraethyldiphenyl sulfone,
4,4'-diamino-3,3',5,5'-tetra(n-propyl)diphenyl sulfone,
4,4'-diamino-3,3',5,5'-tetraisopropyldiphenyl sulfone,
4,4'-diamino-3,3',5,5'-tetrabutyldiphenyl sulfone,
4,4'-diamino-3,3',5,5'-tetramethyldiphenyl ketone,
4,4'-diamino-3,3',5,5'-tetraethyldiphenyl ketone,
4,4'-diamino-3,3',5,5'-tetra(n-propyl)diphenyl ketone,
4,4'-diamino-3,3',5,5'-tetraisopropyldiphenyl ketone,
4,4'-diamino-3,3',5,5'-tetrabutyldiphenyl ketone,
4,4'-diamino-3,3',5,5'-tetramethylbenzanilide,
4,4'-diamino-3,3',5,5'-tetraethylbenzanilide,
4,4'-diamino-3,3',5,5'-tetra(n-propyl)benzanilide,
4,4'-diamino-3,3',5,5'-tetraisopropylbenzanilide, and
4,4'-diamino-3,3',5,5'-tetrabutylbenzanilide.

It is also possible to use, as the diamine (A), siloxydiamines represented by the following formula (2):

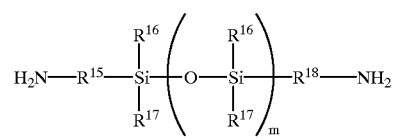
(2)

wherein $R^{15}$ and $R^{18}$ each represents a divalent organic group, $R^{16}$ and $R^{17}$ each represents a monovalent organic group and m stands for an integer of 1–100.

In the above formula (2), $R^{15}$ and $R^{18}$ may independently be a trimethylene group [—$(CH_2)_3$—], a tetramethylene group [—$(CH_2)_4$—], a toluylene group

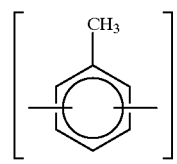

or a phenylene group

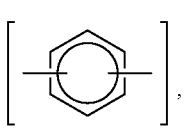

while $R^{16}$ and $R^{17}$ may independently be a methyl, ethyl or phenyl group. Plural $R^{16}$s and $R^{17}$s can be either the same or different.

Where $R^{15}$ and $R^{18}$ each represents a trimethylene groups and $R^{16}$ and $R^{17}$ each represents a methyl group in the formula (2), siloxane diamines in which m is 1, about 10 on average, about 20 on average, about 30 on average, about 50 on average and about 100 on average, respectively, are all commercially available from Shin-Etsu Chemical Co., Ltd.

under the trade names of "LP-7100", "X-22-161AS", "X-22-161A", "X-22-161B", "X-22-161C" and "X-22-161E".

Examples of the diisocyanate (A'), which are usable in the present invention, include those similar to the above-exemplified diamines except for the substitution of isocyanate groups for the amino groups.

Examples of the acid anhydride (B), which are usable in the present invention, include:

trimellitic anhydride,
pyromellitic dianhydride,
3,3',4,4'-benzophenonetetracarboxylic dianhydride (BTDA),
3,3',4,4'-biphenyltetracarboxylic dianhydride
2,2-bis(3,4-dicarboxyphenyl)hexafluoropropane dianhydride
bis(3,4-dicarboxyphenyl)ether dianhydride,
bis(3,4-dicarboxyphenyl)sulfone dianhydride,
4,4'-bis(3,4-dicarboxyphenoxy)diphenylsulfone dianhydride,
2,2-bis[4-(3,4-dicarboxyphenoxy)phenyl]propane dianhydride,
ethylene glycol bistrimellitate dianhydride (EBTA),
decamethylene glycol bistrimellitate dianhydride (DBTA),
bisphenol A bistrimellitate dianhydride (BABT),
2,2-bis[4-(3,4-dicarboxybenzoyloxy)phenyl] hexafluoropropane dianhydride,
1,4-bis[1-methyl-1-{4-(3,4-dicarboxybenzoyloxy)-phenyl}ethyl]benzene dianhydride,
maleic anhydride,
methylmaleic anhydride,
nadic anhydride,
allyinadic anhydride
methyinadic anhydride
tetrahydrophthalic anhydride, and
methyltetrahydrophthalic anhydride.

Illustrative of the dicarboxylic acid, which are usable in the present invention, include terephthalic acid, isophthalic acid, biphenylcarboxylic acid, phthalic acid, naphthalenedicarboxylic acid and diphenyletherdicarboxylic acid. Examples of the amide-forming derivatives of these dicarboxylic acids include dichlorides, dialkyl esters and the like of the dicarboxylic acids exemplified above.

Further, the diamine (A) or the dicarboxylic acid (C) may partially be replaced by an aminocarboxylic acid such as aminobenzoic acid.

Preferred examples of the diamine (A), which are usable for the provision of the heat-resistant adhesives according to the present invention, include:

alkylene diamine,
metaphenylene diamine,
2,4-diaminotoluene,
4,4'-diaminodiphenyl ether (DDE),
4,4'-diaminodiphenyl methane,
4,4'-diaminodiphenyl sulfone,
3,3'-diaminodiphenyl sulfone,
3,3'-diaminobenzophenone,
1,3-bis(4-aminocumyl)benzene,
1,4-bis(4-aminocumyl)benzene,
1,3-bis(3-aminophenoxy)benzene,
1,4-bis(3-aminophenoxy)benzene,
1,4-bis(4-aminophenoxy)benzene,
2,2-bis[4-(4-aminophenoxy)phenyl]propane (BAPP),
bis[4-(3-aminophenoxy)phenyl]sulfone (m-APPS),
bis[4-(4-aminophenoxy)phenyl]sulfone,
2,2-bis[4-(4-aminophenoxy)phenyl]hexafluoropropane,
4,4'-diamino-3,3',5,5'-tetramethyldiphenylmethane,
4,4'-diamino-3,3',5,5'-tetraethyldiphenylmethane,
4,4'-diamino-3,3',5,5'-tetraisopropyldiphenylmethane,
4,4'-diamino-3,3'-dimethyl-5,5'-diethyldiphenylmethane,
4,4'-diamino-3,3'-dimethyl-5,5'-diisopropyldiphenylmethane,
4,4'-diamino-3,3'-diethyl-5,5'-diisopropyldiphenylmethane,
4,4'-diamino-3,3'-dimethyldiphenylmethane,
4,4'-diamino-3,3'-diethyldiphenylmethane, or
4,4'-diamino-3,3'-diisopropyldiphenylmethane.

In addition, it is also preferred to use commercially-available "LP-7100", "X-22-161AS" and "X-22-161A" as the siloxanediamine of the formula (2).

Preferred examples of the acid anhydride (B) include:
trimellitic anhydride,
3,3',4,4'-benzophenonetetracarboxylic dianhydride (BTDA),
2,2-bis(3,4-dicarboxyphenyl)hexafluoropropane dianhydride,
bis(3,4-dicarboxyphenyl)ether dianhydride,
bis(3,4-dicarboxyphenyl)sulfone dianhydride,
4,4'-bis(3,4-dicarboxyphenoxy)diphenylsulfone dianhydride,
2,2-bis[4-(3,4-dicarboxyphenoxy)phenyl]propane dianhydride,
ethyleneglycolbistrimellitate dianhydride (EBTA),
decamethylene glycol bistrimellitate dianhydride (DBTA),
bisphenol A bistrimellitate dianhydride (BABT),
1,4-bis[1-methyl-1-{4-(3,4-dicarboxybenzoyloxy)-phenyl}ethyl]benzene dianhydride,
maleic anhydride,
nadic anhydride, and
allyinadic anhydride.

Incidentally, nadic anhydride has the following structural formula:

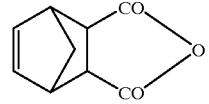

and allylnadic anhydride has the following structural formula:

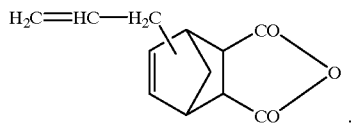

When producing the resin by using the diamine (A), the acid anhydride (B) and the dicarboxylic acid (C), it is necessary to select and combine these monomers so that the resulting resin preferably has Tg of 200° C. or higher, more preferably 250° C. or higher.

To obtain a heat-resistant adhesive having characteristics specified in this invention, a polyimide and a polyamide may be mixed so that the resultant adhesive preferably has Tg of 200° C. or higher.

Without needing being limited to the polyimide and polyamide, polymaleimides and polyallylnadimides can also be employed likewise for the production of heat-resistant adhesives of the present invention.

Polyimides can be obtained by thermal or chemical ring closure of the corresponding polyamic acids. It is not necessary but desirable that the polyimide used in this invention has been completely imidated.

The heat-resistant adhesive according to the present invention may be composed of a polyimide or a polyamide alone or may be a mixture obtained by combining the polyimide and the polyamide and, if necessary, an epoxy resin, a curing agent, a curing accelerator and/or the like.

In this case, it has been found that even if a heat-resistant adhesive has Tg lower than 200° C., mixing of an additional resin such as an epoxy resin and one or more of the below-described additives, such as a coupling agent, make it possible to adjust its water absorption rate and coming-out length within the respective ranges specified in the present invention.

No particular limitation is imposed on the epoxy resin which can be mixed with a specific heat-resistant polyimide adhesive of the present invention, in so far as it has at least 2 epoxy groups on average per molecule. Examples of such an epoxy resin include the glycidyl ether of bisphenol A, the glycidyl ether of bisphenol F, phenolnovolak type epoxy resins, polyglycidyl esters of polyhydric alcohols, polyglycidyl esters of polybasic acids, alicylic epoxy resins and hydantoin epoxy resins.

In addition, fillers such as ceramic powder, glass powder, silver powder and copper powder and coupling agents can also be added to the heat-resistant adhesive of the present invention. The heat-resistant adhesive according to the present invention can also be used after impregnating it with a base sheet such as glass fabric, aramid fabric and carbon fiber fabric.

Usable examples of the coupling agent include:
vinylsilanes such as vinyltriethoxysilane, vinyltrimethoxysilane, and γ-methacryloxy propyltrimethoxysilane;
epoxysilanes such as γ-glycidoxypropyltrimethoxysilane, γ-glycidoxypropylmethyldiethoxysilane, and β-(3,4-epoxycyclohexyl)ethyltrimethoxysilane;
aminosilanes such as γ-aminopropyltriethoxysilane, γ-aminopropyltrimehtoxysilane, and N-phenyl-γ-aminopropyltrimethoxysilane;
mercaptosilanes such as γ-mercaptopropyltrimethoxysilane; and
coupling agents such as titanates, aluminum chelates and zircoaluminates.

Of these, silane coupling agents are preferred with epoxysilane coupling agents being particularly preferred. Incidentally γ-methacryloxypropyltrimethoxysilane has the following structural formula:

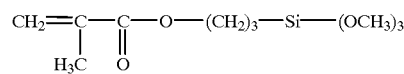

whereas γ-glycidoxypropyltrimethoxysilane has the following structural formula:

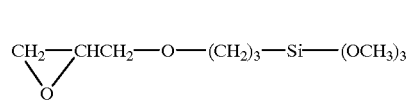

In the adhesive member, the heat-resistant adhesive according to the present invention can be used either alone, that is, by itself or by coating it on a base film or impregnating a base sheet with it. When the heat-resistant adhesive is used alone, it can be coated directly on an object to be bonded, such as a semiconductor chip or a lead frame, or can be formed into a sheet-like form in advance, applied to the object and then compression bonded on the object under heat.

The adhesive member comprising the adhesive of the present invention is formed in a shape and and imparted with properties suitable for bonding the semiconductor chip to the lead frame in the manufacture of a sealed type semiconductor package, especially an LOC semiconductor package. More specifically, the adhesive member employing the adhesive of the present invention has a shape and properties suitable for bonding between the semiconductor chip and the lead frame of the sealed type semiconductor package having no tab where wire bonding for connecting the semiconductor chip and the lead frame is made on the semiconductor chip.

When the heat-resistant adhesive according to the present invention is used as a composite adhesive sheet by coating it on a base film (or sheet), the composite adhesive sheet can be obtained by coating a heat-resistant adhesive having a water absorption rate of not more than 3 wt. % and a coming-out length of not more than 2 mm and, preferably, a glass transition temperature of at least 200° C. or a varnish thereof on both surfaces of a heat-resistant film, preferably a surface-treated heat-resistant film.

The coating layer of each major surface of the heat-resistant film is formed by the same or different heat-resistant adhesive according to the present invention.

Examples of the heat-resistant film usable as the base film in the present invention include films of engineering plastics such as polyimides, polyamides, polysulfones, polyphenylene sulfides, polyetheretherketones and polyarylates.

The heat-resistant film has a glass transition temperature (Tg) which is higher than that (Tg) of the heat-resistant adhesive according to the present invention and is preferably at least 200° C., more preferably 250° C. or higher. The heat-resistant film has a water absorption rate of not more than 3 wt. %, preferably 2 wt. % or lower.

Accordingly, the heat-resistant film employed in this invention may preferably be a polyimide film in view of Tg, water absorption rate and coefficient of thermal expansion. Particularly preferred is a film equipped with the physical properties that the Tg is at least 250° C., the water absorption rate is 2 wt. % or less and a coefficient of thermal expansion of $3 \times 10^{-5}$/° C. or lower.

To increase adhesion with the adhesive, it is desired to apply surface treatment to the heat-resistant film. Surface treatment methods include chemical surface treatment methods such as alkali treatment and silane coupling treatment, physical treatment method such as sand blasting, plasma etching, and corona etching. Although they are all usable, it is desired to choose and use a most suitable treatment method depending on the adhesive. As surface treatment applied to a heat-resistant film upon application of the heat-resistant adhesive of this invention, chemical treatment or plasma etching is particularly preferred.

No particular limitation is imposed on the manner of coating the heat-resistant adhesive (varnish) on the heat-resistant film. The coating can be applied in any suitable manner by using, for example, a doctor blade, a knife coater, a die coater or the like. The film may be coated by feeding it through a varnish. This method is however not preferred because it is difficult to control the thickness.

When the film coated with the heat-resistant adhesive of this invention is subjected to heat treatment for the elimination of a solvent or for imidation, the temperature of the heat treatment varies depending on whether the heat-resistant adhesive so coated is a varnish of a polyamic acid or a varnish of a polyimide.

In the case of the varnish of the polyamic acid, a temperature of Tg or higher is needed to achieve imidation. In the case of the varnish of the polyimide, no particular limitation is imposed insofar as it is high enough to eliminate the solvent. To improve the adhesion between the adhesive and the heat-resistant film, it is preferred to conduct the above heat treatment at a temperature of 250° C. or higher.

The adhesive member making use of the heat-resistant adhesive according to the present invention is particularly effective for the bonding between a lead frame and a semiconductor chip.

When the adhesive according to the present invention is used for the bonding of the semiconductor chip and the lead frame, no particular limitation is imposed on the manner of the bonding. This bonding can be achieved by a method most suited for each package so fabricated.

Various bonding methods can be used, including, for example:

(1) A composite sheet with a heat-resistant adhesive according to the present invention coated on opposite surfaces thereof is first compression-bonded onto a lead frame under heat. A semiconductor chip is then compression-bonded under heat onto the heat-resistant adhesive of this invention on the opposite surface.

(2) A sheet with a heat-resistant adhesive according to the present invention coated on one surface thereof is first compression-bonded onto a lead frame under heat. The opposite surface of the sheet is then coated with the same adhesive or another adhesive according to the present invention, onto which a semiconductor chip is compression-bonded.

(3) A film consisting of a heat-resistant adhesive of this invention alone is held between a semiconductor chip and a lead frame and is then compression-bonded under heat.

(4) A heat-resistant adhesive according to the present invention is coated on a semiconductor chip or a lead frame and is compression-bonded with a lead frame or a semiconductor chip.

Specific methods for bonding a semiconductor chip to a lead frame by using an adhesive member making use of a heat-resistant adhesive according to the present invention will be described with reference to FIGS. 1 to 3.

Figure 2:
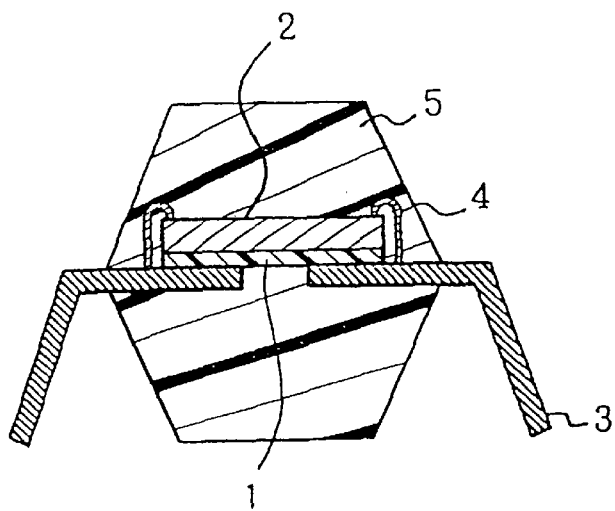
FIG. 2 schematically illustrates a semiconductor package similar to that of FIG. 1 except that a semiconductor chip is located above a lead frame.
Figure 3:
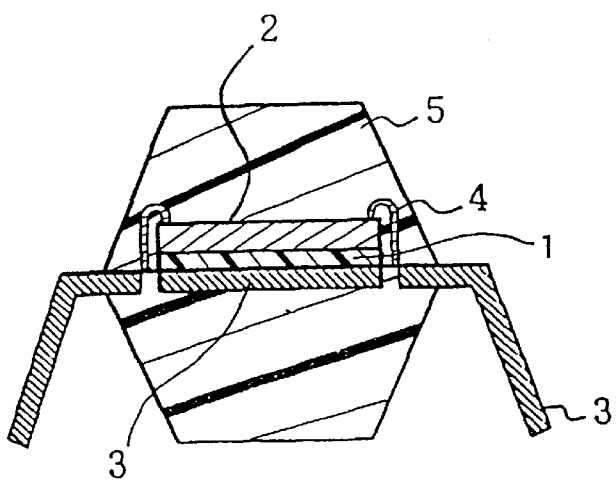
FIG. 3 schematically illustrates a semiconductor package similar to that of FIG. 1 except that a semiconductor chip is located above a lead frame.

FIGS. 1 to 3 are schematic illustrations of the semiconductor packages, in which the shapes of the lead frames and the positions of the semiconductor chips bonded on the lead frames are different. Each semiconductor package has been fabricated by bonding the semiconductor chip to the lead frame with the adhesive member making use of the heat-resistant adhesive according to the present invention and then molding the semiconductor chip and a bonded part between the semiconductor chip and the lead frame with a molding compound.

In FIG. 1, the semiconductor is positioned below the lead frame.

In FIG. 2, the semiconductor is positioned above the lead frame.

In FIG. 3, the semiconductor is also positioned above the lead frame.

In FIGS. 1 to 3, there are shown the adhesive members at numeral 1, the semiconductor chips at numeral 2, the lead frames at numeral 3, wires at numeral 4 and the sealants at numeral 5.

The adhesive member making use of the heat-resistant adhesive according to the present invention are effective for bonding a semiconductor chip with a lead frame so as to fabricate the semiconductor package in LOC structure as illustrated in FIG. 1. The semiconductor package of LOC structure is characterized by having a lead frame 3 and a semiconductor chip 2 which is connected to one of major surfaces (herein, called "lower surface") of the lead frame 3 via an adhesive member 1, and in that the other surface (herein, called "upper surface") of the lead frame 3 and the semiconductor chip 2 are conductively connected via a wire 4. The connecting position of the wire 4 and the lead frame 3 is in the hypothetical shadow cast by projecting the semiconductor chip 2 perpendicularly on the upper surface of the lead frame 3. The package of LOC (lead on chip) structure as shown in FIG. 1 is different from the COL (chip on lead) package of FIG. 2 and the package of FIG. 3 in that the rate of the volume occupied by the chip in the package is larger as compared with those of the two others. This is because (1) the package of FIG. 1 has not a tab while the package FIG. 3 has; and (2) the wire bonding is made above the chip in the package of FIG. 1, while it is made on the surfaces of the chip in the packages of FIGS. 2 and 3, thus saving a space for the wire bonding in addition to the space where the chip is mounted. This increases the rate of the space occupied by the chip in the package of FIG. 1 and accordingly reduces the thickness of the sealing material, increasing the possibility of occurrence of the package cracks due to the adhesive, as compared with the packages of FIGS. 2 and 3. Thus, an effective measure for reducing the possibility of occurrence of the cracks has been provided. The adhesive of the present invention is especially effective for prevention or reduction of occurrence of the cracks in the package as shown in FIG. 1.

According to the following steps, a semiconductor package can be manufactured.

In a case where the semiconductor package is fabricated by using adhesive varnish, the varnish is first coated on an object. Then, a semiconductor chip is mounted on the film of the varnish after the coated object is dried by heating at 100–300° C. for 1 second to 120 minutes, preferably, at 150–250° C. for 5 seconds to 60 minutes. Thereafter, the semiconductor chip is pressed, while being heated, onto the object under a condition at 200–500° C. under 0.01–10 MPa for 0.01 seconds to 10 minutes, preferably, at 250–400° C. under 0.1–7 MPa for 0.1–5 seconds, and then, the chip is wire-bonded, for example, with a gold line. The wire bonding may be performed by supersonic wave, heat pressing or the both. The, a semiconductor package is obtained by molding so as to cover the semiconductor chip.

In a case where an adhesive (single or complex) sheet is used, in order to eliminate water contained in the adhesive sheet, the sheet is heated in advance at 100–300° C. for 0.1–30 minutes, preferably, at 150–250° C. for 1–10 minutes, to effect preliminary drying. Next, the sheet is cut to a desired size. At this stage, the sheet may be stamped out with a metal mold or cut out by a cutter or the like. The next steps are heat pressing the adhesive sheet onto a bonding surface of a lead frame and heat pressing a bonding surface of a semiconductor chip onto the adhesive sheet. The heat pressing is performed under a condition at 200–500° C.

under 0.01–10 MPa for 0.1 seconds to 10 minutes, preferably, 250–400° C. under 0.1–7 MPa for 0.1–5 seconds. After the adhesive sheet is heat pressed onto the bonding surface of the semiconductor chip, the adhesive sheet, which is bonded to the semiconductor chip, may be heat pressed onto the bonding surface of the lead frame. Finally, as in the above described case of using adhesive varnish, a semiconductor package is obtained by performing wire-bonding and molding.

Here, the wire-bonding is to conductably connect the semiconductor chip and a lead frame via a wire.

The above-mentioned molding can be performed with powdery molding compound using a metal mold, such as a transfer mold, or with liquid molding compound using no metal mold.

In the present invention, the molding compound may be powdery or liquid, which may be thermosetting resin or thermoplastic resin.

In a case where the molding is performed with powdery molding compound using a metal mold, it is preferable to use a molding compound whose main component is epoxy resin, under a condition at 140–200° C., for 30 seconds to 3 minutes under 30–200 kg/cm$^2$.

In a case where the molding is performed with liquid molding compound without a metal mold, it is preferable to use a molding compound whose main component is epoxy resin, at room temperature to 150° C., for 30 seconds to 1 hour.

Without being limited thereto the present invention, it can also be effectively applied for the bonding of objects such as ceramic plates, metal plates, metal foils, plastic films, plastic plates and laminates.

Upon bonding each of such objects, the object can be bonded to another object by coating the adhesive onto the first-mentioned object or where the adhesive is in the form of a sheet, interposing it between the objects, heating the adhesive at a temperature equal to or higher to the softening point of the adhesive and then applying pressure.

The present invention will hereinafter be described specifically by the following examples. It should however be borne in mind that this invention is by no means limited to or by the examples.

EXAMPLE 1

In a four-necked flask equipped with a stirrer, a thermometer, a nitrogen inlet tube and a calcium chloride tube, 3.66 g (10 mmole) of 4,4'-diamino-3,3',5,5'-tetraisopropyldiphenylmethane (IPDDM) and 28.3 g of N,N-dimethylformamide (DMF) were charged and dissolved. While being cooled below 5° C., the resulting solution was added with 5.76 g (10 mmole) of bisphenol A bistrimellitate dianhydride (BABT) in portions. They were reacted for one hour under cooling below 5° C. and then for 6 hours at room temperature, whereby a polyamic acid was synthesized. To the resultant reaction solution containing the polyamic acid, 2.55 g of acetic anhydride and 1.98 g of pyridine were added, followed by reaction at room temperature for 3 hours, whereby a polyimide was synthesized.

The reaction solution containing the polyimide so obtained was poured into water and the resulting precipitate was collected, pulverized and dried, whereby the polyimide was obtained in the form of powder.

The polyimide powder so obtained was dissolved in DMF at a concentration of 0.1 g/dl. The reduced viscosity of the polyimide solution as measured at 30° C. was 0.71 dl/g.

In addition, a solubility test of the polyimide powder was conducted by adding it to various organic solvents to give a concentration of 5 wt. % and then observing its state of dissolution at room temperature. As a result, the polyimide powder was found to be soluble in each of DMF, N-methylpyrrolidone (NMP), methylene chloride, dioxane, THF and toluene.

Further, the polyimide powder was dissolved in DMF. The varnish so obtained was cast onto a glass plate and dried at 100° C. for 10 minutes. The resulting green film was peeled off from the glass plate, fixed on an iron frame and dried at 250° C. for one hour, whereby a film was obtained.

As a result of measurement of the glass transition temperature (Tg) of the thus-obtained polyimide film by the penetration method under a load of 25 kg/cm$^2$ at a heating rate of 10° C./min, it was found to be 262° C. The heat decomposition temperature of the polyimide film was 405° C.

The film was immersed in water of 25° C. for 24 hours. As a result, it was found to have a water absorption rate of 0.3 wt. %.

A 19×50 mm wide adhesive film of 25 μm in thickness was pressed at 350° C. under 3 MPa for one minute. The length of a came-out peripheral portion (hereinafter called "coming-out length" for the sake of brevity) of the adhesive as measured at a central part in the direction of the longer surfaces of the adhesive film was found to be 0.8 mm.

In addition, a flexibility test was conducted by bending the polyimide film over an angle of 180°. The film developed no cracks, thus showing good flexibility.

An NMP varnish of the polyimide was coated onto a film of "UPILEX S" (trade name; polyimide film; product of Ube Industries, Ltd.) which had been plasma-etched, followed by drying at 100° C. for 10 minutes and then at 300° C. for 10 minutes, whereby a composite sheet was obtained. The composite sheet so obtained was superposed on a 42 alloy (Fe—Ni alloy whose nickel content is 42%) sheet, followed by pressing at 350° C. under 3 MPa for 5 seconds. As a result of measurement of the 90° peel strength of the composite sheet, it was found to be 0.7 kN/m.

Using the composite sheet, a semiconductor chip of TSOP (thin small out-line package) type was packaged as shown in FIG. 1. That is, the composite sheet is preliminarily dried by heating at 200° C. for one minute, and then cut into a desired size. The sheet is mounted on a lead frame so as to be pressed at 375° C. under 3 MPa for one second. Next, a semiconductor chip is mounted on the sheet so as to be pressed at 400° C. under 3 MPa for 3 seconds. At last, using gold line, wire-bonding with both supersonic and heat was performed, which is followed by molding with epoxy forming material by transfer-mold method at 180° C. for 90 seconds under 70 kg/cm$^2$ and then holding at 180° C. for 5 hours to be cured, so as to obtain a TSOP-type semiconductor package. The package was subjected to moisturization for 48 hours at 85° C. and 85% RH and then immersed in a solder bath of 260° C. No cracks occurred.

EXAMPLE 2

In a similar manner to Example 1 except that 3.58 g (10 mmole) of bis(3,4-dicarboxyphenyl)sulfone dianhydride (DSDA), 1.83 g (5 mmole) of IPDDM and 2.05 g (5 mmole) of 2,2-bis[4-(4-aminophenoxy)phenyl]propane (BAPP) were used instead, a polyamic acid was obtained in the form of varnish. The varnish of the polyamic acid was treated as in Example 1, whereby a polyimide was obtained in the form of powder.

The polyimide so obtained was found to have a reduced viscosity of 1.21 dl/g, Tg of 268° C., a thermal decomposition point of 410° C., a water absorption rate of 0.7 wt. % and a coming-out length of 0.01 mm.

In a similar manner to Example 1 except that the varnish of the polyamic acid was heat-treated at 100° C. for 10 minutes and then at 300° C. for 15 minutes, a composite sheet was obtained. It was found to have an adhesive strength of 1.2 kN/m with a 42-alloy sheet. A semiconductor package of TSOP type obtained as in Example 1 developed no cracks when soldered after moisturization.

EXAMPLE 3

In a similar manner to Example 1 except that 3.22 g (10 mmole) of 3,3',4,4'-benzophenonetetracarboxylic dianhydride (BDTA) and 20.6 g of NMP were used instead of BABT and DMF, respectively, a polyamic acid was obtained in the form of varnish. Xylene (10 g) was added to the varnish so obtained, followed by heating at 180° C. for 5 hours, whereby a polyimide was obtained in the form of varnish.

The polyimide so obtained was found to have a reduced viscosity of 0.48 dl/g, Tg of 300° C., a thermal decomposition temperature of 405° C., a water absorption rate of 1.0 wt. % and a coming-out length of 0.5 mm.

The polyimide varnish was coated onto a film of "KAPTON" (trade name; polyimide film; product of Du Pont-Toray Industries) which had been subjected to silane coupling treatment after alkali treatment. The film so coated was heat-treated at 100° C. for 10 minutes and then at 275° C. for 10 minutes, whereby a composite sheet was obtained. It was found to have an adhesive strength of 0.92 kN/m with a 42-alloy sheet. A semiconductor package of TSOP type obtained as in Example 1 developed no cracks when soldered after moisturization.

EXAMPLE 4

In a similar manner to Example 1 except that 5.76 g (10 mmole) of BABT, 2.38 g (6.5 mmole) of IPDDM and 0.43 g (3.5 mmole) of metatoluylenediamine (MTDA) were used instead, a polyimide was obtained in the form of powder.

The polyimide so obtained was found to have a reduced viscosity of 0.61 dl/g, Tg of 275° C., a thermal decomposition temperature of 415° C., a water absorption rate of 0.5 wt. % and a coming-out length of 1.5 mm.

An NMP varnish of the polyimide was coated onto a "UPILEX S" film which had been subjected to alkali treatment, followed by drying at 100° C. for 10 minutes and then at 300° C. for 10 minutes, whereby a composite sheet was obtained. It was found to have an adhesive strength of 0.85 kN/m with a 42-alloy sheet. The semiconductor package of SOJ (small outline J-leaded package type obtained as in Example 1 developed no cracks when soldered after moisturization.

EXAMPLE 5

In a similar manner to Example 3 except that 3.58 g (10 mmole) of DSDA, 0.92 g (2.5 mmole) of IPDDM and 3.08 g (7.5 mmole) of BAPP were used instead, a polyimide was obtained in the form of powder.

The polyimide so obtained was found to have a reduced viscosity of 0.62 dug, Tg of 255° C., a thermal decomposition temperature of 440° C., and a water absorption rate of 1.2 wt. % and a coming-out length of 0.2 mm.

DMAc varnish of the polyimide was coated onto a plasma-etched film of "UPILEX S", followed by drying at 100° C. for 10 minutes and then at 250° C. for 10 minutes, whereby a composite sheet was obtained. It was found to have an adhesion strength of 1.40 kN/m with a 42-alloy sheet. The semiconductor package of TSOP type obtained as in Example 1 developed no cracks when soldered after moisturization.

EXAMPLE 6

In 24.5 g of DMF, 4.10 g (10 mmole) of BAPP were dissolved, followed by the addition of 2.02 g (20 mmole) of triethylamine. While being cooled below 5° C., the resulting solution was added with 2.03 g (10 mmole) of isophthaloyl chloride in portions. They were reacted for 5 hours below 5° C. As in Example 1, a polyamide was obtained in the form of powder.

The polyamide so obtained was found to have a reduced viscosity of 0.45 dl/g, Tg of 219° C., a thermal decomposition temperature of 425° C., a water absorption rate of 2.3 wt. % and a coming-out length of 2.4 mm.

A DMF varnish with 85 wt. % of a polyimide obtained as in Example 1 and 15 wt. % of the polyamide obtained in this Example mixed therein was coated onto a plasma-etched film of "UPILEX S", followed by drying at 100° C. for 10 minutes and then at 250° C. for 10 minutes, whereby a composite sheet was obtained. The composite sheet so obtained was superposed on a 42 alloy sheet, followed by pressing at 350° C. under 3 MPa for 5 seconds. As a result of measurement of the 90° peel strength of the sheet, it was found to be 1.2 kN/m.

The composite film was found to have Tg of 255° C., a water absorption rate of 0.6 wt. % and a coming-out length of 1.5 mm.

Using the composite sheet, a semiconductor chip of SOJ type was packaged as shown in FIG. 1. The film was subjected to moisturization for 48 hours at 85° C. and 85% RH and then immersed in a solder bath of 260° C. No cracks were occurred.

EXAMPLE 7

In 20 g of DMF, 1.74 g (7 mmole) g of 4,4'-diaminodiphenylsulfone (DDS) and 1.23 g (3 mmole) of BAPP were dissolved, followed by the addition of 2.02 g (20 mmole) of triethylamine. While being cooled below 5° C., the resulting solution was added with 2.03 g (10 mmole) of isophthaloyl chloride in portions. They were reacted for 5 hours below 5° C. As in Example 1, a polyamide was obtained in the form of powder. The polyamide so obtained was found to have a reduced viscosity of 0.88 dl/g, Tg of 260° C., a thermal decomposition temperature of 435° C., a water absorption rate of 2.5 wt. % and a coming-out length of 0.2 mm.

Using an NMP varnish with 60 wt. % of the polyimide obtained as in Example 1 and 40 wt. % of the polyamide obtained in this Example mixed therein, a composite sheet was obtained in a similar manner to Example 1. The adhesive strength of the composite sheet so obtained with a 42 alloy sheet was found to be 1.6 kN/m.

The composite film was found to have Tg of 260° C., a water absorption rate of 1.1 wt. % and a coming-out length of 0.5 mm.

Using the composite sheet, a semiconductor chip of TSOP type was packaged as in Example 1. The package developed no cracks when soldered subsequent to moisturization.

EXAMPLE 8

In a similar manner to Example 6 except that 1.83 g (5 mmole) of IPDDM, 2.05 g (5 mmole) of BAPP, 0.64 g (3 mmole) of 4-chloroformylbenzene-1,2-dicarboxylic anhydride, 0.30 g (3 mmole) of triethylamine and 30 g of NMP were used instead, a polyamic acid was obtained in the form of varnish. The varnish so obtained was added with 2.51 g (7 mmole) of bis(3,4-dicarboxyphenyl)sulfone dianhydride (DSDA) in portions below 5° C., followed by reaction below 5° C. for 5 hours. Acetic anhydride and pyridine were thereafter added to the reaction mixture. Following the procedures described in Example 1, a polyamide-imide was obtained in the form of powder.

The polyamide-imide so obtained was found to have a reduced viscosity of 1.15 dl/g, Tg of 258° C., a thermal decomposition temperature of 385° C., a water absorption rate of 1.0 wt. % and a coming-out length of 0.02 mm.

A DMAc varnish of the polyamide-imide was coated onto a "KAPTON" film which had been subjected to silane coupling treatment after alkali treatment. The film so coated was heat-treated at 100° C. for 10 minutes and then at 275° C. for 10 minutes, whereby a composite sheet was obtained. It was found to have an adhesive strength of 1.4 kN/m with a 42-alloy sheet. A semiconductor package of TSOP type obtained as in Example 1 developed no cracks when soldered after moisturization.

EXAMPLE 9

In a similar manner to Example 1 except that 5.76 g (10 mmole) of BABT, 2.74 9 (7.5 mmole) of IPDDM, 0.41 g (1.0 mmole) of BAPP and 1.26 g (1.5 mmole) of "X-22-161AS" were used instead, a polyimide was obtained in the form of powder. The polyimide so obtained was found to have a reduced viscosity of 0.65 dl/g, Tg of 226° C., a thermal decomposition temperature of 396° C., a water absorption rate of 0.3 wt. % and a coming-out length of 1.7 mm.

An NMP varnish of the polyimide so obtained was coated onto a plasma-etched film of "UPILEX S", followed by drying at 100° C. for 10 minutes and then at 300° C. for 10 minutes, whereby a composite sheet was obtained. The composite sheet so obtained was found to have an adhesive strength of 0.80 kN/m. A semiconductor package of SOJ type obtained as in Example 1 developed no cracks when soldered after moisturization.

EXAMPLE 10

In a similar manner to Example 1 except that 3.58 g (10 mmole) of DSDA and 4.32 g (10 mmole) of bis[4-(4-aminophenoxy)phenyl]sulfone were used instead, a polyimide was obtained in the form of powder.

The polyimide so obtained was found to have a reduced viscosity of 0.87 dl/g, Tg of 270° C., a thermal decomposition temperature of 520° C., a water absorption rate of 2.3 wt. % and a coming-out length of 0.01 mm.

An NMP varnish of the polyimide so obtained was coated onto a plasma-etched film of "UPILEX S", followed by drying at 100° C. for 10 minutes and then at 300° C. for 10 minutes, whereby a composite sheet was obtained. The composite sheet so obtained was found to have an adhesive strength of 1.0 kN/m. A semiconductor package of TSOP type obtained as in Example 1 developed no cracks when soldered after moisturization.

EXAMPLE 11

As in Example 1, a film composed of an adhesive alone was formed using the polyimide of Example 2. A semiconductor package of TSOP type obtained using the so-formed film in a similar manner to Example 1 developed no cracks when soldered after moisturization.

EXAMPLE 12

An adhesive layer was formed on a semiconductor chip by using an NMP varnish of the polyamide-imide which had been obtained in Example 8. A semiconductor package of TSOP type formed as shown in FIG. 1 by using the chip with the adhesive layer thereon developed no cracks even when it was soldered after moisturization as in Example 1.

EXAMPLE 13

In 23.0 g of NMP, 2.87 g (7 mmole) of BAPP and 0.75 g (3 mmole) of "LP-7100" were dissolved. While being cooled below 5° C., the resulting solution was added with 2.13 g (10 mmole) of 4-chloroformylbenzene-1,2-dicarboxylic anhydride in portions. To the resulting mixture, 2.02 g (20 mmole) of triethyl amine were added, followed by the reaction for 5 hours below 5° C. As in Example 1, a polyamide-imide was obtained in the form of powder.

The polyamide-imide so obtained was found to have a reduced viscosity of 0.57 dl/g, Tg of 185° C., a thermal decomposition temperature of 420° C., a water absorption rate of 0.13 wt. % and a coming-out length of 0.8 mm.

A varnish which had been obtained by dissolving 100 g of the polyamide-imide powder and 3 g of γ-glycidoxypropyltrimethoxysilane in 400 g of DMF was coated on one surface of a polyimide film ("UPILEX S", trade name), followed by drying at 100° C. for 10 minutes. The other surface of the polyimide film was also coated with the varnish similarly, followed by drying at 250° C. for 10 minutes, whereby a composite sheet was obtained. The composite sheet so obtained was found to have an adhesive strength of 1.6 kN/m with a 42 alloy sheet. The adhesive layers were found to have Tg of 185° C., a water absorption rate of 1.3 wt. % and a coming-out length of 0.2 mm.

First, the composite sheet was pressed and adhered to a lead frame at 350° C. under 6 MPa for 3 seconds and then a chip was pressed and adhered to the other side of the sheet at 375° C. under 6 MPa for 3 seconds. After wire bonding, the resulting wired chip was molded with epoxy forming material, as a sealant, by transfer-mold method at 180° C. for 90 seconds under 70 kg/cm$^2$ and then held at 180° C. for 5 hours to be cured. The TSOP-type-package so obtained was subjected to moisturization at 85° C. and 85% RH for 48 hours, and solder was then caused to reflow in a infrared oven controlled at 245° C. No cracks were developed.

EXAMPLE 14

In 34.7 g of NMP, 3.69 g (9 mmole) of BAPP and 0.88 g (1 mmole) of X-22-161AS were dissolved. Below 5° C., 4.10 g (10 mmole) of ethyleneglycolbistrimellitate dianhydride were thereafter added to the resulting solution in portions, followed by the reaction for 2 hours. To the reaction mixture, 15 g of xylene were added. The resulting mixture was reacted at 180° C. for 5 hours under a nitrogen gas stream while condensed water was azeotropically removed together with xylene, whereby a polyimide was synthesized. The reaction mixture containing the polyimide so synthesized was poured into water and the resulting precipitate was collected, pulverized and dried, whereby the polyimide was obtained in the form of powder.

The polyimide so obtained was found to have a reduced viscosity of 0.65 dl/g, Tg of 170° C., a thermal decomposition temperature of 390° C., a water absorption rate of 1.0 wt. % and a coming-out length of 1.8 mm.

Using a varnish obtained by dissolving 100 g of the polyimide powder and 5 g of γ-glycidoxypropylmethyldiethoxysilane in 400 g of DMF, a composite sheet was obtained as in Example 13. The composite sheet had an adhesive strength of 1.3 kN/m with a 42 alloy sheet. In addition, the adhesive layers were found to have Tg of 172° C., a water absorption rate of 1.0 wt. % and a coming-out length of 1.8 mm.

A semiconductor package of SOJ type obtained as in Example 13 developed no cracks when soldered after moisturization.

EXAMPLE 15

In a similar manner to Example 13 except that 3.28 g (8 mmole) of BAPP, 0.40 g (2 mmole) of dodecamethylenediamine and 2.13 g (10 mmole) of 4-chloroformylbenzene-1,2-dicarboxylic anhydride, a polyamide-imide was obtained in the form of powder.

The polyamide-imide so obtained was found to have a reduced viscosity of 0.85 dl/g, Tg of 190° C., a thermal decomposition temperature of 395° C., a water absorption rate of 0.1 wt. % and a coming-out length of 0.6 mm.

A varnish obtained by dissolving 100 g of the polyamide-imide powder and 10 g of γ-glycidoxypropylmethyldiethoxysilane in 400 g of NMP was coated on both surfaces of a polyimide film ("UPILEX S", trade name). The varnish so coated was dried at 100° C. for 10 minutes and then at 275° C. for 10 minutes, whereby a composite sheet was obtained. The composite sheet was found to have an adhesive strength of 1.4 kN/m with a 42 alloy sheet. In addition, the adhesive layers were found to have Tg of 191° C., a water absorption rate of 1.1 wt. % and a coming-out length of 0.2 mm.

A semiconductor package of TSOP type obtained as in Example 13 developed no cracks when soldered after moisturization.

COMPARATIVE EXAMPLE 1

Using a DMF varnish of the polyamide obtained in Example 6, a composite sheet was obtained in a similar manner to Example 1. The adhesive strength of the sheet with 42 alloy sheet was found to be 1.60 kN/m. A semiconductor package of TSOP type obtained as in Example 1 developed cracks when soldered after moisturization.

COMPARATIVE EXAMPLE 2

In 20 g of DMF, 2.11 g (8.5 mmole) of DDS and 0.62 g (1.5 mmole) of BAPP were dissolved, followed by the addition of 2.02 g (20 mmole) of triethylamine. While being cooled below 5° C., the resulting mixture was added with 2.03 g (10 mmole) of isophthaloyl chloride in portions. They were reacted below 5° C. for 5 hours. In a similar manner to Example 1, a polyamide was obtained in the form of powder.

The polyamide so obtained was found to have a reduced viscosity of 0.45 dl/g, Tg of 280° C., a thermal decomposition temperature of 430° C., a water absorption rate of 3.5 wt. % and a coming-out length of 1.2 mm.

A varnish of the above polyamide was coated onto a "KAPTON" film which had been subjected to silane coupling treatment after alkali treatment. The film so coated was heat-treated at 100° C. for 10 minutes and then at 250° C. for 10 minutes, whereby a composite sheet was obtained. It was found to have an adhesion strength of 1.5 kN/m with a 42-alloy sheet. A semiconductor package of TSOP type obtained as in Example 1 developed cracks when soldered after moisturization.

COMPARATIVE EXAMPLE 3

In a similar manner to Example 4, polyimide powder having a reduced viscosity of 0.35 dl/g was obtained. The polyimide so obtained was found to have Tg of 275° C., a thermal decomposition temperature of 410° C., a water absorption rate of 0.6 wt. % and a coming-out length of 3.4 mm.

The composite sheet obtained following the procedures described in Example 4 was found to have an adhesive strength of 0.9 kN/m with a 42-alloy sheet. A semiconductor package of SOJ type obtained as in Example 1 developed cracks when soldered after moisturization.

COMPARATIVE EXAMPLE 4

In a similar manner to Example 1 except that 4.10 g (10 mmole) of ethyleneglycolbistrimellitate dianhydride and 4.32 g (10 mmole) of bis[4-(3-aminophenoxy)phenyl] sulfone instead, a polyimide was obtained in the form of powder.

The polyimide so obtained was found to have a reduced viscosity of 0.44 dl/g, Tg of 187° C., a thermal decomposition temperature of 465° C., a water absorption rate of 1.1 wt. % and a coming-out length of 2.2 mm.

A semiconductor package of TSOP type obtained as in Example 1 developed cracks when soldered after moisturization. Those results are shown in Table 1.

TABLE 1 (1)

| | Composition of adhesive Acid component/amine component = 10/10 | | Reduced viscosity (dl/g) | Tg (° C.) | Water absorption rate (wt. %) | Coming-out length (mm) | Cracks |
|---|---|---|---|---|---|---|---|
| Ex. 1 | BABT/IPDDM | | 0.71 | 262 | 0.3 | 0.8 | Not observed at 260° C. |
| Ex. 2 | DSDA/IPDDM BAPP | 5 5 | 1.21 | 268 | 0.7 | 0.01 | Not observed at 260° C. |
| Ex. 3 | BTDA/IPDDM | | 0.48 | 300 | 1.0 | 0.5 | Not observed at 260° C. |
| Ex. 4 | BABT/IPDDM MTDA | 6.5 3.5 | 0.61 | 275 | 0.5 | 1.5 | Not observed at 260° C. |

TABLE 1 (1)-continued

| | Composition of adhesive Acid component/amine component = 10/10 | | Reduced viscosity (dl/g) | Tg (° C.) | Water absorption rate (wt. %) | Coming-out length (mm) | Cracks |
|---|---|---|---|---|---|---|---|
| Ex. 5 | DSDA/IPDDM | 2.5 | 0.62 | 255 | 1.2 | 0.2 | Not observed at 260° C. |
| | BAPP | 7.5 | | | | | |
| Ex. 6 | (1) IP/BAPP | | 0.45 | 219 | 2.3 | 2.4 | Not observed at 260° C. |
| | Polyimide of Ex. 1 | 85 wt. % | — | 255 | 0.6 | 1.5 | |
| | Polyamide of (1) | 15 wt. % | | | | | |

TABLE 1 (2)

| | Composition of adhesive Acid component/amine component = 10/10 | | Reduced viscosity (dl/g) | Tg (° C.) | Water absorption rate (wt. %) | Coming-out length (mm) | Cracks |
|---|---|---|---|---|---|---|---|
| Ex. 7 | (2) IP/DDS | 7 | 0.88 | 260 | 2.5 | 0.2 | Not observed at 260° C. |
| | BAPP | 3 | | | | | |
| | Polyimide of Ex. 1 | 60 wt. % | — | 260 | 1.1 | 0.5 | |
| | Polyamide of (2) | 40 wt. % | | | | | |
| Ex. 8 | TA 3/IPDDM 5 | | 1.15 | 258 | 1.0 | 0.02 | Not observed at 260° C. |
| | DSDA 7/BAPP 5 | | | | | | |
| Ex. 9 | BABT/IPDDM | 7.5 | 0.65 | 226 | 0.3 | 1.7 | Not observed at 260° C. |
| | BAPP | 1.0 | | | | | |
| | "161AS" | 1.5 | | | | | |
| Ex. 10 | DSDA/p-APPS | | 0.87 | 270 | 2.3 | 0.01 | Not observed at 260° C. |
| Ex. 11 | A film composed of polyimide of Ex. 2 alone | | 1.21 | 268 | 0.7 | 0.01 | Not observed at 260° C. |
| Ex. 12 | A polyamide-imide of Ex. 8 coated on a chip | | 1.15 | 258 | 1.0 | 0.02 | Not observed at 260° C. |

TABLE 1 (3)

| | Composition of adhesive Acid component/amine component = 10/10 | | Reduced viscosity (dl/g) | Tg (° C.) | Water absorption rate (wt. %) | Coming-out length (mm) | Cracks |
|---|---|---|---|---|---|---|---|
| Comp. Ex. 1 | Polyamide (1) of Ex. 6 | | 0.45 | 219 | 2.3 | 2.4 | Observed at 260° C. |
| Comp. Ex. 2 | IP/DDS | 8.5 | 0.45 | 280 | 3.5 | 1.2 | Observed at 260° C. |
| | BAPP | 1.5 | | | | | |
| Comp. Ex. 3 | BABT/IPDDM | 6.5 | 0.35 | 275 | 0.6 | 3.4 | Observed at 260° C. |
| | MTDA | 3.5 | | | | | |
| Comp. Ex. 4 | EBTA/m-APPS | | 0.44 | 187 | 1.1 | 2.2 | Observed at 260° C. |
| Ex. 13 | (3) TA/BAPP | 7 | 0.57 | 185 | 1.3 | 0.8 | Not observed at 245° C. |
| | "LP-7100" | 3 | | | | | |
| | Polyimide of (3) | 100 wt. % | — | 185 | 1.3 | 0.2 | |
| | τ-GPTM | 3 wt. % | | | | | |

TABLE 1 (4)

| | Composition of adhesive Acid component/amine component = 10/10 | | Reduced viscosity (dl/g) | Tg (° C.) | Water absorption rate (wt. %) | Coming-out length (mm) | Cracks |
|---|---|---|---|---|---|---|---|
| Ex. 14 | (4) EBTA/BAPP | 9 | 0.65 | 170 | 1.0 | 1.8 | Not observed at 245° C. |
| | "161AS" | 1 | | | | | |
| | Polyimide of (4) | 100 wt. % | — | 172 | 1.0 | 1.0 | |
| | τ-GPME | 5 wt. % | | | | | |
| Ex. 15 | (5) TA/BAPP | 8 | 0.85 | 190 | 1.0 | 0.6 | Not observed at 245° C. |
| | DDMA | 2 | | | | | |
| | Polyimide of (5) | 100 wt. % | — | 191 | 1.1 | 0.2 | |
| | τ-GPTM | 10 wt. % | | | | | |

IP: Isophthalic acid
TA: Trimellitic anhydride
"LP-7100": Siloxyamine; trade name; product of Shin-Etsu Chemical Co., Ltd.
IPDDM: 4,4'-Diamino-3,3',5,5'-tetraisopropyldiphenylmethane
DDS: 4,4'-Diaminodiphenylsulfone
BTDA: 3,3',4,4'-benzophenonetetracarboxylic dianhydride
BAPP: 2,2-bis[4-(4-aminophenoxy)phenyl]propane
DSDA: Bis[3,4-dicarboxyphenyl]sulfone dianhydride
"161AS": "X-22-161AS": siloxyamine; trade name; product of Shin-Etsu Chemical Co., Ltd.
p-APPS: Bis[4-(4-aminophenoxy)phenyl]sulfone
m-APPS: Bis[4-(3-aminophenoxy)phenyl]sulfone
EBTA: Ethyleneglycolbistrimellitate dianhydride
DDMA: Dodecamethylenediamine
γ-GPTM: γ-Glycidoxypropyltrimethoxysilane
γ-GPME: γ-Glycidoxypropylmethyldiethoxysilane

What is claimed is:

1. A fabrication process of a semiconductor package, comprising the steps of:
   (1) bonding a semiconductor chip to a first side of two substrates of a lead frame with an adhesive member;
   (2) conductively connecting a second side of said two surfaces of said lead frame and said semiconductor chip via a wire; and
   (3) molding a molding compound so that the molding compound covers at least said semiconductor chip and a bonded part between the semiconductor chip and said frame, wherein
      said wire and said lead frame are connected at a position inside a shadow which is formed by projecting said semiconductor chip vertically on said second side of said lead frame; and
      said adhesive member is a composite adhesive sheet comprising a heat-resistant film and a coating layer of an adhesive applied on both major surfaces of the heat resistant film; and
      said adhesive member is made of polyimide or polyamide and includes a heat-resistant adhesive having a coming-out length of not more than 2 mm and a water absorption rate of not more than 3 wt. % wherein
         the coming-out length of said adhesive is measured by the steps of pressing a film of said adhesive having a size of 19 mm×50 mm with a thickness of 25 μm at 350° C. under 3 Mpa for one minute; and
         measuring a coming-out length of said adhesive at a central part in the direction of the longer surface of said adhesive film.

2. A fabrication process of a semiconductor package as defined in claim 1, wherein the glass transition temperature of said heat-resistant adhesive is 200° C. or higher.

3. A fabrication process of a semiconductor package as defined in claim 1, wherein the adhesive applied in the form of the coating layer on one of said major surfaces of said heat-resistant film comprises a heat-resistant adhesive which is different from the adhesive applied in the form of the coating layer on the other of said major surfaces of the heat-resistant film.

4. A fabrication process of a semiconductor package as defined in claim 1, wherein the adhesive applied in the form of the coating layer on one of said major surfaces of said heat-resistant film comprises a heat-resistant adhesive which is the same as the adhesive applied in the form of the coating layer on the other of said major surfaces of the heat-resistant film.

5. A fabrication process of a semiconductor package as defined in claim 1, wherein the glass transition temperature of said heat-resistant film is higher than the glass transition temperature of said heat-resistant adhesive.

6. A fabrication process of a semiconductor package as defined in claim 1, wherein the glass transition temperature of said heat-resistant adhesive is 200° C. or higher.

7. A fabrication process of a semiconductor package as defined in claim 2, wherein the adhesive applied in the form of the coating layer on one of said major surfaces of the heat-resistant film comprises a heat-resistant adhesive which is different from the heat-resistant adhesive applied in the form of the coating layer on the other of said major surfaces of the heat-resistant film.

8. A fabrication process of a semiconductor package as defined in claim 7, wherein the glass transition temperature of said heat-resistant film is higher than the glass transition temperature of said heat-resistant adhesive.

9. A fabrication process of a semiconductor package as defined in claim 2, wherein the adhesive applied in the form of the coating layer on one of said major surfaces of said heat-resistant film comprises a heat-resistant adhesive which is the same as the adhesive applied in the form of the coating layer on the other of said major surfaces of the heat-resistant film.

10. A fabrication process of a semiconductor package as defined in claim 9, wherein the glass transition temperature of said heat-resistant film is higher than the glass transition temperature of said heat-resistant adhesive.

11. A fabrication process of a semiconductor package as defined in claim 3, wherein the glass transition temperature of said heat-resistant film is higher than the glass transition temperature of said heat-resistant adhesive.

12. A fabrication process of a semiconductor package as defined in claim 4, wherein the glass transition temperature of said heat-resistant film is higher than the glass transition temperature of said heat-resistant adhesive.

13. A fabrication process of a semiconductor package according to claim 1, wherein said step (3) is a step of molding said molding compound in a manner that the molding compound covers the bonded part where said semiconductor chip is bonded to said lead frame, and an entire surface of said semiconductor chip.

* * * * *